US007573179B2

(12) United States Patent
Okuda

(10) Patent No.: US 7,573,179 B2
(45) Date of Patent: Aug. 11, 2009

(54) DRIVING METHOD OF LIQUID DROP EJECTING HEAD AND LIQUID DROP EJECTING APPARATUS

(75) Inventor: Masakazu Okuda, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 434 days.

(21) Appl. No.: 11/283,171

(22) Filed: Nov. 18, 2005

(65) Prior Publication Data

US 2006/0214538 A1 Sep. 28, 2006

(30) Foreign Application Priority Data

Mar. 25, 2005 (JP) ............................ 2005-090082

(51) Int. Cl.
*H02N 2/00* (2006.01)
*H01L 41/00* (2006.01)

(52) U.S. Cl. ...................................... 310/315; 310/317

(58) Field of Classification Search ................. 310/315, 310/317

See application file for complete search history.

(56) References Cited

U.S. PATENT DOCUMENTS

| | | | | |
|---|---|---|---|---|
| 5,736,994 | A * | 4/1998 | Takahashi | 347/11 |
| 6,049,345 | A * | 4/2000 | Nishio et al. | 347/151 |
| 6,109,716 | A * | 8/2000 | Takahashi | 347/11 |
| 6,141,113 | A * | 10/2000 | Takahashi | 358/1.8 |
| 6,371,607 | B2 * | 4/2002 | Wouters et al. | 347/89 |
| 6,575,544 | B2 * | 6/2003 | Iriguchi | 347/11 |
| 6,685,300 | B1 * | 2/2004 | Ishiyama et al. | 347/23 |
| 2001/0040595 | A1 * | 11/2001 | Taki et al. | 347/9 |
| 2003/0107617 | A1 * | 6/2003 | Okuda et al. | 347/57 |

* cited by examiner

*Primary Examiner*—Stephen D Meier
*Assistant Examiner*—Sarah Al-Hashimi
(74) *Attorney, Agent, or Firm*—Fildes & Outland, P.C.

(57) ABSTRACT

Disclosed herein is a driving method of a liquid drop ejecting head in which an oscillatory wave is imparted to a liquid accommodated in a pressure chamber using an electromechanical transducer, which is driven by applying a predetermined driving waveform to the electromechanical transducer, thereby discharging a liquid drop from a nozzle to record an image. The driving method comprising: detecting an environmental temperature, and expanding and/or contracting the driving waveform to be applied to the electromechanical transducer, in a voltage axial direction and a time axial direction, in accordance with the detected environmental temperature, and applying the resulting driving waveform to the electromechanical transducer. Also disclosed is adjusting the waveform of a reverberation adjustor portion of the driving waveform, which adjusts a residual oscillation of the liquid, in accordance with the detected environmental temperature.

22 Claims, 12 Drawing Sheets

DRIVING METHOD OF LIQUID DROP EJECTING HEAD AND LIQUID DROP EJECTING APPARATUS

CROSS-REFERENCE TO RELATED APPLICATION

This application claims priority under 35 USC 119 from Japanese Patent Application No. 2005-090082, the disclosure of which is incorporated by reference herein.

BACKGROUND OF THE INVENTION

1. Field of the Invention

The present invention relates to a driving method of a liquid drop ejecting head for discharging liquid drops to record an image.

2. Description of the Related Art

As liquid drop ejecting heads using an electromechanical transducer (such as piezoelectric actuator), there conventionally exists ink-jet recording heads for discharging ink drops onto recording sheets to record images.

In such an ink-jet recording head of this kind, if a driving waveform is applied to an electromechanical transducer, the meniscus action of a nozzle can be precisely controlled and by doing so, it is possible to undertake high frequency ejection, to eject microdrops, and to prevent satellite drops and mist from being generated. The driving waveform to be applied to the electromechanical transducer is set in accordance with ejection efficiency of the head (ejector) and pressure wave natural oscillation period (Helmholtz oscillation period (Tc)).

In recent years, for ink-jet recording heads, in order to reduce bleeding of ink on the recording sheet and to realize high quality image recording and double-sided printing, the need for liquid drop ejecting heads capable of ejecting high viscosity ink is increasing. In industrial uses other than image recording, if high viscosity liquid can be ejected, there is a merit that the application range of an apparatus can be greatly enlarged.

When high viscosity liquid is to be ejected from an liquid drop ejecting head, however, various problems occur. For example, when such high viscosity liquid is ejected, ejection efficiency of an ejector and refilling ability of the ejector are deteriorated due to the influence of the viscosity of the ink, it is necessary to increase the size of the pressure chamber, and to design flow paths such that fluid resistance is reduced in the nozzle and liquid supply paths.

In the case of high viscosity liquid, the amount of variation in viscosity caused by environmental temperature changes is also increased. For example, in the case of low viscosity liquid having a viscosity of 3 mPa·s, viscosity variation range in the environmental temperature of 5 to 40° C. is about 1.5 to 6 mPa·s, but in the case of high viscosity liquid having viscosity of 20 mPa·s, the viscosity variation range is increased as high as about 10 to 40 mPa·s. Such a large variation of viscosity caused by the environmental temperature has a large effect on the ejection characteristics of an ejector. That is, ejection efficiency of the ejector varies greatly with the environmental temperature. Large variation is generated also in the natural oscillation period Tc of pressure wave, and when the environmental temperature is varied to low or high temperature, there is a problem that liquid drop cannot be ejected normally.

To eliminate the variation in environmental temperature, conventionally proposed is to heat the entire liquid drop ejecting head by a heater, and to keep the ink in the heat at a constantly high temperature (e.g., see Japanese Patent Application Laid-Open (JP-A) No. 11-170515).

There is also proposed a technique for varying driving waveform in accordance with the environmental temperature. For example, JP-A No. 11 -170522 describes a technique in which the voltage of the driving waveform is varied in accordance with the variation in environmental temperature, JP-A No. 2002-326357 describes a technique in which the pulse width of a rectangular driving waveform is varied in accordance with the variation in environmental temperature, and JP-A No. 10-151770 describes a technique in which the time interval of a portion of the driving waveform is varied in accordance with the environmental temperature.

According to the technique described in the above JP-A No. 11-170515, however, there is a problem that it leads to the apparatus size and cost being increased, and it takes a long time to warm up the apparatus.

As to the techniques of JP-A Nos. 11-170522, 2002-326357 and 10-151770, they depend only on a variation of the ejection efficiency caused by variation in environmental temperature, and these techniques cannot handle the variation of the pressure wave natural oscillation period Tc in accordance with environmental temperature. That is, using only these conventional techniques, it is impossible to prevent variation of ejection characteristics caused by environmental temperature in the liquid drop ejecting head which ejects high viscosity liquid, and to realize stable ejection.

SUMMARY OF THE INVENTION

The present invention has been accomplished in the light of the above problems, and provides a driving method of a liquid drop ejecting head and a liquid drop ejecting apparatus capable of excellent ejection of high viscosity liquids irrespective of the environmental temperature.

A first aspect of the present invention provides a driving method of a liquid drop ejecting head in which an oscillatory wave is imparted to a liquid accommodated in a pressure chamber using an electromechanical transducer which is driven by applying a predetermined driving waveform to the electromechanical transducer, thereby discharging a liquid drop from a nozzle to record an image, the driving method comprising: detecting an environmental temperature, and expanding and/or contracting the driving waveform to be applied to the electromechanical transducer in a voltage axial direction and/or a time axial direction in accordance with the detected environmental temperature, and applying the resulting driving waveform to the electromechanical transducer.

A second aspect of the present invention provides a driving method of a liquid drop ejecting head in which an oscillatory wave is imparted to a liquid accommodated in a pressure chamber using an electromechanical transducer which is driven when a predetermined driving waveform is applied to the electromechanical transducer, thereby discharging a liquid drop from a nozzle to record an image, the driving method comprising: detecting an environmental temperature, and expanding and/or contracting the driving waveform to be applied to the electromechanical transducer, in a voltage axial direction and/or a time axial direction, in accordance with the detected environmental temperature and applying the resulting driving waveform to the electromechanical transducer, wherein the expansion and/or contraction of the driving waveform are carried out in the voltage axial direction and time axial direction such that the magnitude of the driving waveform is increased as the detected environmental temperature becomes lower, the expansion and/or contraction of the driving waveform are carried out such that the expansion ratio and/or contraction ratio of the driving waveform becomes constant with respect to a reference potential, in the driving waveform to be applied to the electromechanical transducer, a waveform of a reverberation adjustor, which adjusts a residual oscillation of the liquid, is adjusted in accordance with the detected environmental temperature and is applied to the electromechanical transducer, the shape of the waveform of the reverberation adjustor is changed such that the residual oscillation is amplified as the detected environmental temperature becomes lower, the shape of the waveform of the reverberation adjustor is changed such that the residual oscillation is suppressed as the detected environmental temperature becomes higher.

A third aspect of the present invention provides a liquid drop ejecting apparatus in which an oscillatory wave is imparted to liquid accommodated in a pressure chamber using an electromechanical transducer which is driven when a predetermined driving waveform is applied to the electromechanical transducer, thereby discharging a liquid drop from a nozzle to record an image, the liquid drop ejecting apparatus comprising, a detecting unit for detecting environmental temperature, and a driving waveform adjusting unit which expands and/or contracts the driving waveform to be applied to the electromechanical transducer, in a voltage axial direction and a time axial direction, in accordance with the detected environmental temperature, and which applies the resulting driving waveform to the electromechanical transducer.

Other aspects, features and advantages of the present invention will become apparent from the following description taken in conjunction with the accompanying drawings.

BRIEF DESCRIPTION OF THE DRAWINGS

Preferred embodiments of the present invention will be described in detail based on the following figures, in which.

DETAILED DESCRIPTION OF THE INVENTION

In this embodiment, a case in which the present invention is applied to an ink-jet recording head of a printer will be explained.

Figure 1:
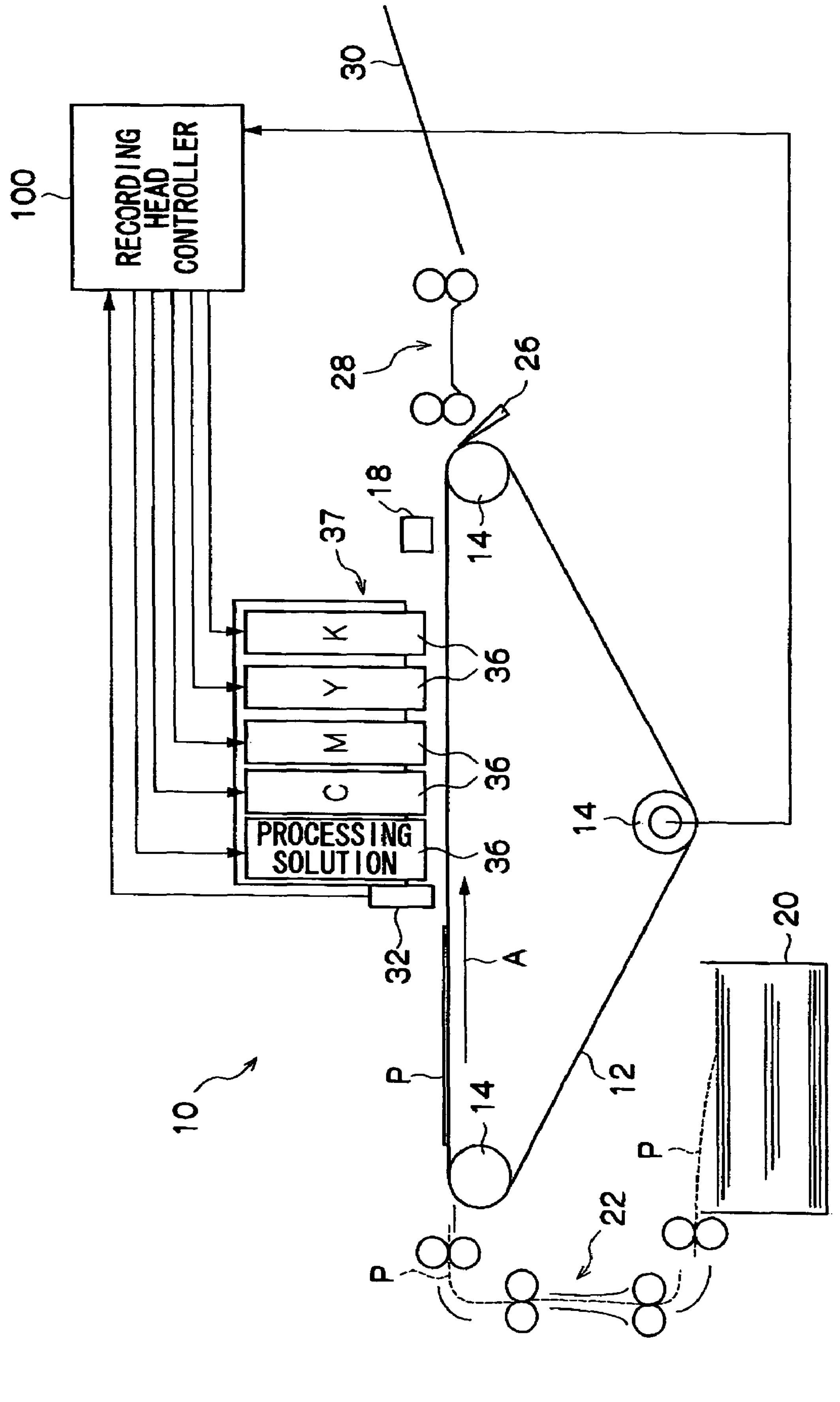
FIG. 1 is a schematic diagram showing a structure of Full Width Array (FWA) type ink-jet printer according to an embodiment of the present invention.

FIG. 1 is a schematic diagram of a Full Width Array (FWA) type ink-jet printer (simply "printer", hereinafter) 10 according to the embodiment.

In the printer 10, a transfer belt 12 is wound around a plurality of rollers 14 and the transfer belt 12 revolves around the rollers 14 in a direction shown with A in FIG. 1. One or more of the rollers 14 are drive rollers, which receive a driving force of a drive (not shown) and rotate, and other rollers 14 follow the drive rollers and rotate.

A paper tray 20 is disposed in the printer 10, and recording sheets P for recording images are stacked and accommodated in the paper tray 20. The recording sheets P accommodated in the paper tray 20 are taken out one sheet at a time from the uppermost sheet by a pickup mechanism (not shown) and are guided into a sheet transfer path 22, and sent out into a predetermined position on the transfer belt 12 by the sheet transfer path 22. The transfer belt 12 has a function for holding the recording sheets P in a close contact manner. With this function, the recording sheets P sent by the sheet transfer path 22 are transferred in the direction A held in a state of close contact.

A recording head unit 37 is disposed in the printer 10 along a transfer path of the recording sheets P and downstream, in the transfer direction, from the predetermined position at which the recording sheets P are sent onto the transfer belt 12. The recording head unit 37 is provided with five recording heads 36 for discharging a processing soluciton, cyan (C) ink, magenta (M) ink, yellow (Y) ink and black (B) ink, and these recording heads 36 are disposed in this order from the upstream side in the transfer direction of the recording sheets P of the transfer belt 12. The transferred recording sheets P are opposed to the respective recording heads 36 in succession.

In each of the recording heads 36, a large number of ink ejecting nozzles 40 are disposed (not shown, see FIG. 2), and the ink ejecting nozzles 40 are arranged in the entire region in the widthwise direction of the transfer belt 12 perpendicular with the direction A.

The recording heads 36 are driven by a recording head controller 100, and the recording heads 36 are structured such that ink drops of respective colors are ejected from the ink ejecting nozzles 40 provided in each recording head 36. With this structure, ink drops are ejected from the opposed recording heads 36 onto the recording sheets P, which are in close contact with the transfer belt 12, and a full color image is recorded.

The processing solution stimulates the penetration ability to the inks of CMYK colors of recording sheets P. The processing solution discharging recording head 36 executes liquid drop ejection, so-called pre-processing, with respect to all of the printing dots irrespective of the image data, but this processing solution discharging recording head 36 is not essential for image formation.

A scraper 26 is provided on the transfer path of the recording sheets P at the transfer belt 12 and downstream from the recording head unit 37 such that the scraper 26 is located at the position of the roller 14 that is located at a curved portion of the transfer path. The scraper 26 separates the recording sheet P in which the image recording is completed from the transfer belt 12, and sends the recording sheet into a catch tray 30 through a ejection path 28.

Figure 2:
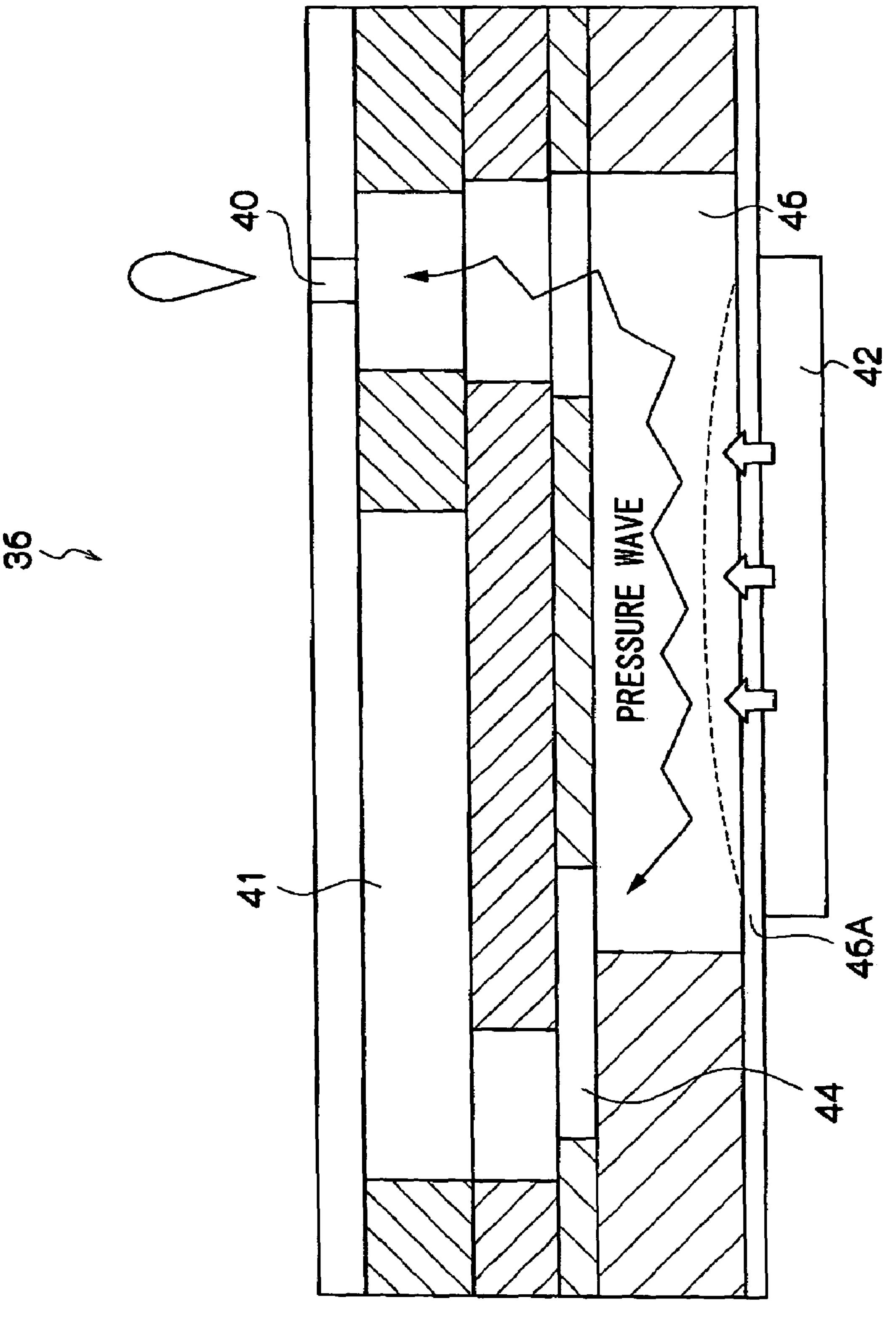
FIG. 2 is a schematic sectional view showing a mechanism for discharging ink of a recording head of an embodiment of the invention.

The recording head 36 includes the ink ejecting nozzles 40, as shown in FIG. 2, with an ink tank 41, a supply path 44, a pressure chamber 46 and a piezoelectric element 42 as an electromechanical converting element.

An appropriate amount of ink or processing solution (collectively referred to as "ink or the like", hereinafter) is supplied from an ink cartridge (not shown) to the ink tank 41, and is temporarily stored therein. The ink tank 41 is in communication with the pressure chamber 46 through a supply path 44, and the pressure chamber 46 is in communication with outside through the ink ejecting nozzle 40.

A diaphragm 46A constitutes a portion of a wall surface of the pressure chamber 46, and the piezoelectric element 42 is mounted on the diaphragm 46A.

A volume in the pressure chamber 46 is contracted or expanded by the unimorph structure of the piezoelectric element 42 and the diaphragm 46A. That is, ink or the like stored in the ink tank 41 is ejected from the ink ejecting nozzle 40 through the supply path 44 and the pressure chamber 46 by oscillatory wave (also called pressure wave) of the ink or the like generated by variation in volume in the pressure chamber 46. The piezoelectric element 42 is driven by a driving waveform, which is input, from the recording head controller 100 in accordance with the image data.

It has been found that the viscosity of the ink varies depending upon the environmental temperature, and the ink ejection by the recording head 36 cannot be favorably carried out due to the variation in ink viscosity in some cases.

Figure 3:
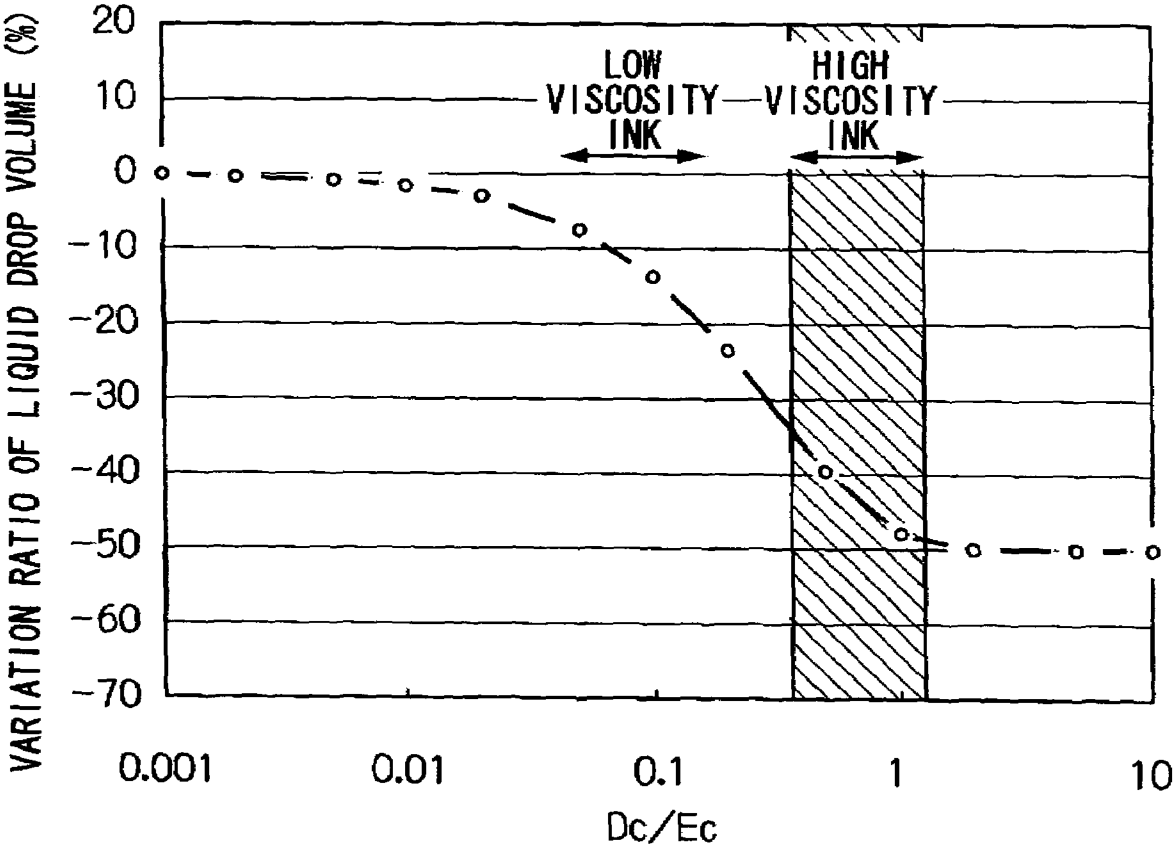
FIG. 3 is a diagram showing a relation between a rate of change in liquid drop volume (ejection efficiency), an attenuation constant Dc of pressure wave and an angular frequency Ec of pressure wave.

FIG. 3 shows a relation between a rate of change of liquid drop volume (which is proportional to ejection efficiency), and a ratio of an attenuation constant Dc of pressure wave and an angular frequency Ec of pressure wave. Here, the attenuation constant Dc of the pressure wave and the angular frequency Ec can be expressed by the following equations using inertance $m_2$ of the supply path 44, inertance $m_3$ of the ink ejecting nozzle 40, acoustic resistance $r_3$ of the ink ejecting nozzle 40, acoustic volume $c_0$ [m5/N] of the drive portion, and acoustic volume $c_1$ of the pressure chamber 46.

$$D_c = \frac{r_3}{2m_3}$$

$$E_c = \sqrt{\frac{m_2 + m_3}{m_2 m_3 (c_0 + c_1)} - D_c^2}$$

FIG. 3 shows, in the regions indicated with "low viscosity ink" and "high viscosity ink", the ranges of values of Dc/Ec that typical low viscosity ink (3 mPa·s) and the typical high viscosity ink (10 mPa·s) can assume at environmental temperatures of from 5 to 35° C. (this is calculated with respect to a general ink-jet recording head as shown in FIG. 2 as one example). As shown in FIG. 2, even if general low viscosity ink (about 3 mPa·s) is used or high viscosity ink as shown in this embodiment is used, the ejection efficiency is influenced by viscosity variation caused by the environmental temperature.

Figure 4:
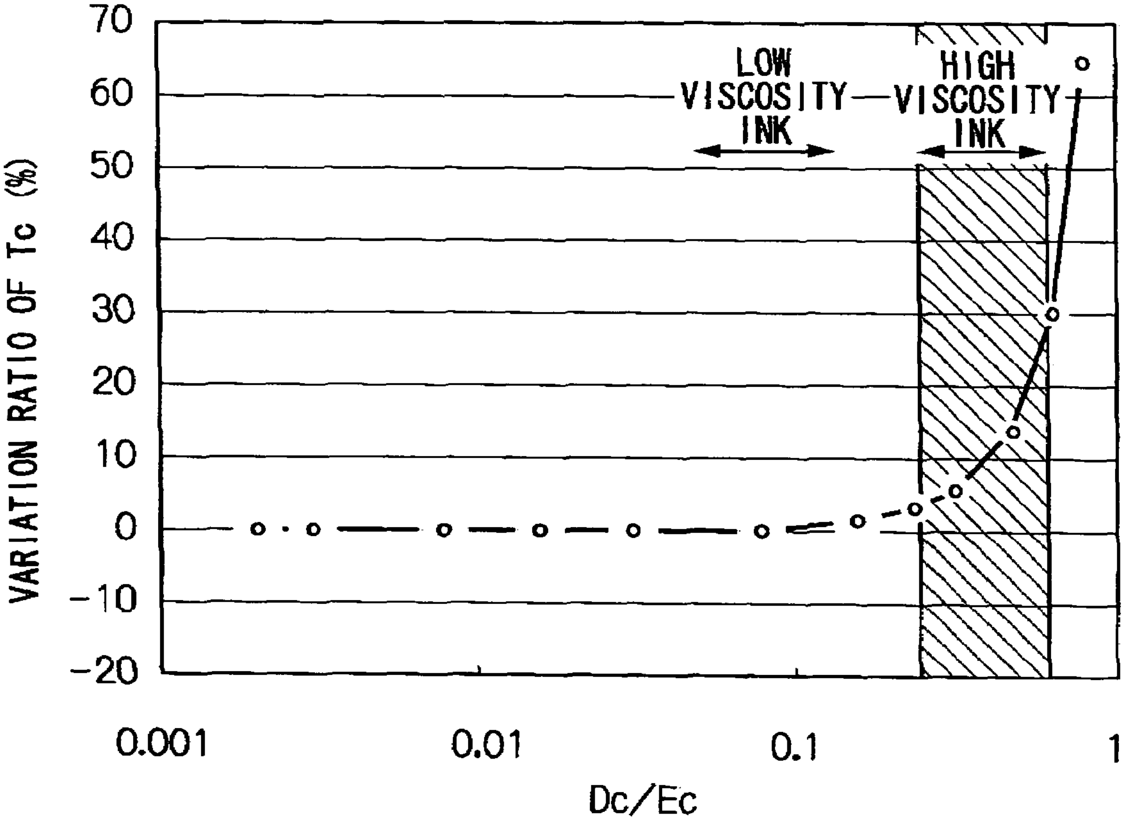
FIG. 4 is a diagram showing a relation between a rate of change of natural oscillation period Tc of pressure wave, the attenuation constant Dc of pressure wave and the angular frequency Ec of pressure wave.

FIG. 4 shows a relation between a rate of change of natural oscillation period Tc of a pressure wave and a ratio of the attenuation constant Dc of the pressure wave and the angular frequency Ec of the pressure wave. Here, in regions indicated with "low viscosity ink" and "high viscosity ink", the range of values which can be assumed of Dc/Ec for typical low viscosity ink (3 mPa·s) and typical high viscosity ink (10 mPa·s) are shown for environmental temperature of from 5 to 35° C. As shown in FIG. 4, there is a tendency that the natural oscillation period Tc of pressure wave is increased when the rate Dc/Ec of the attenuation constant Dc and the angular frequency Ec of the pressure wave is high, and it can be found that the variation of the natural oscillation period Tc is great particularly in a range of Dc/Ec>0.2.

Ink having a viscosity of about 3 mPa·s is used in a general ink-jet recording head. In this case, even if the environmental temperature is varied, since there is a tendency that Dc/Ec smaller than 0.2 exists, variation of the natural oscillation period Tc caused by variation of the environmental temperature can, in the most part, be ignored.

On the other hand, when high viscosity ink having viscosity of 10 mPa·s or higher is used, since the relation Dc/Ec>0.2 exists, it is necessary to design the driving waveform while sufficiently taking, into consideration, the variation of the natural oscillation period Tc caused by the variation of the environmental temperature. That is, the present invention is based on the fact that when high viscosity liquid is ejected using a liquid drop ejecting head, variation of the environmental temperature generates a large variation of the pressure wave natural oscillation period Tc, and this affects the ejection stability of the liquid drop greatly. Although JP-A Nos. 11-170515, 11-170522, 2002-326357 and 10-151770 disclose that the driving waveform varies with the environmental temperature, there no example exists in the past of varying the driving waveform while taking the variation of the pressure wave natural oscillation period into consideration.

Figure 5:
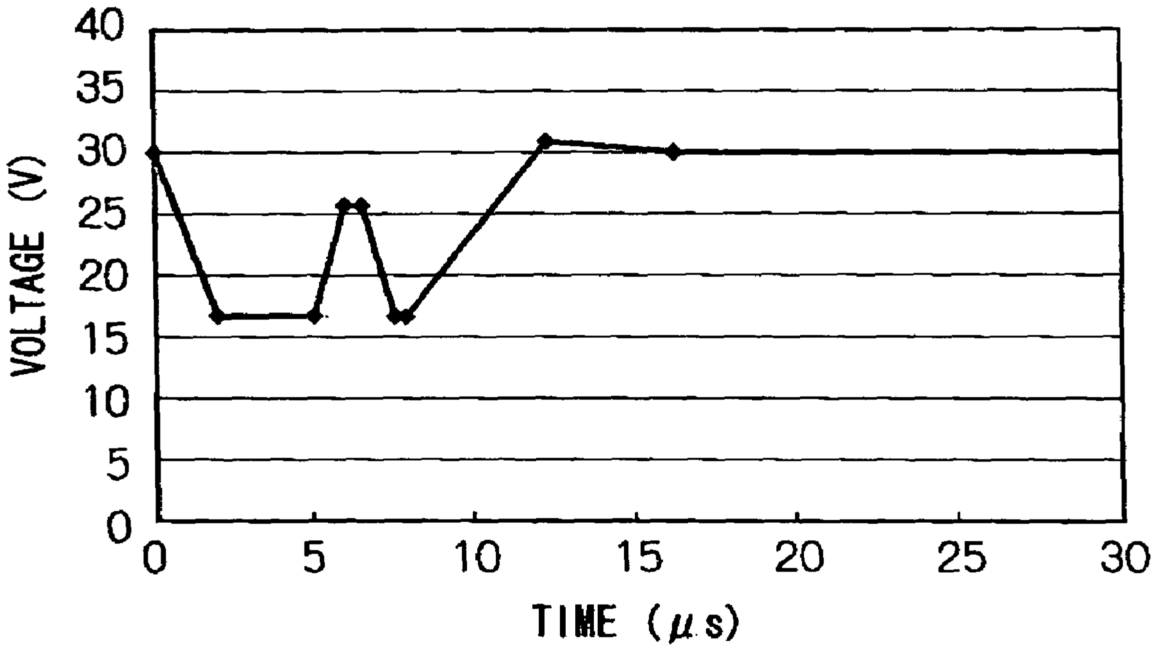
FIG. 5 is a diagram showing a general waveform for driving a fine drop ejection, which is applied to a piezoelectric element 42 when a fine drop is ejected from an ink ejecting nozzle 40.
Figure 6A:
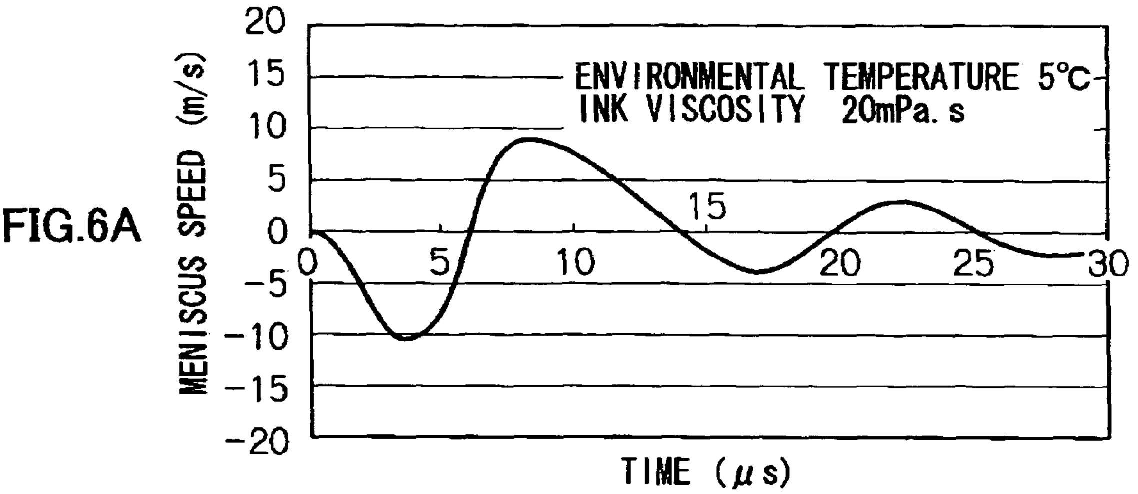
FIGS. 6A, 6B and 6C shows measurement results of meniscus speed when the same kind of ink was charged, only the environmental temperatures were set to 5° C., 25° C. and 35° C., respectively, and fine drop ejection driving waveform shown in FIG. 5 was applied to the piezoelectric element 42 of a recording head 36.
Figure 6B:
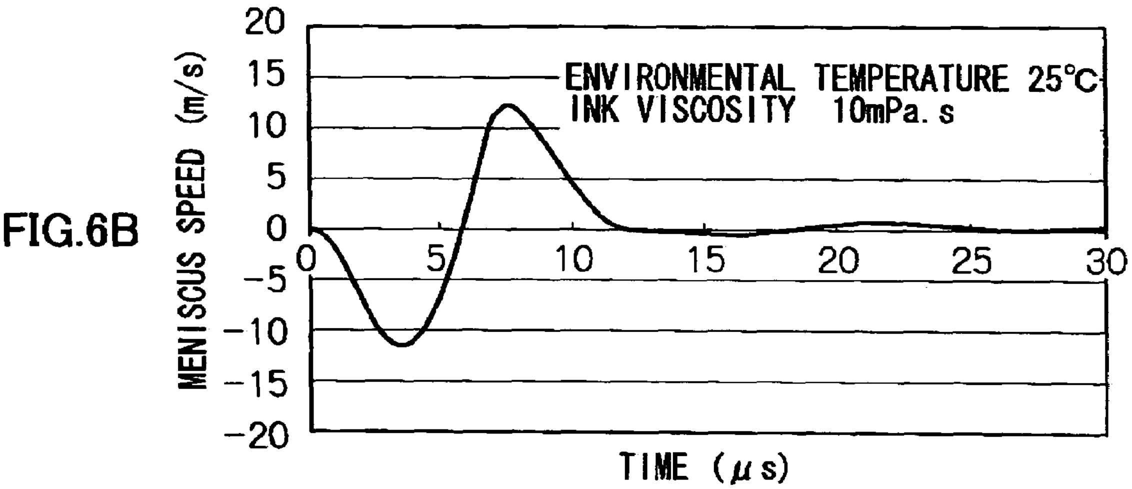
Figure 6C:
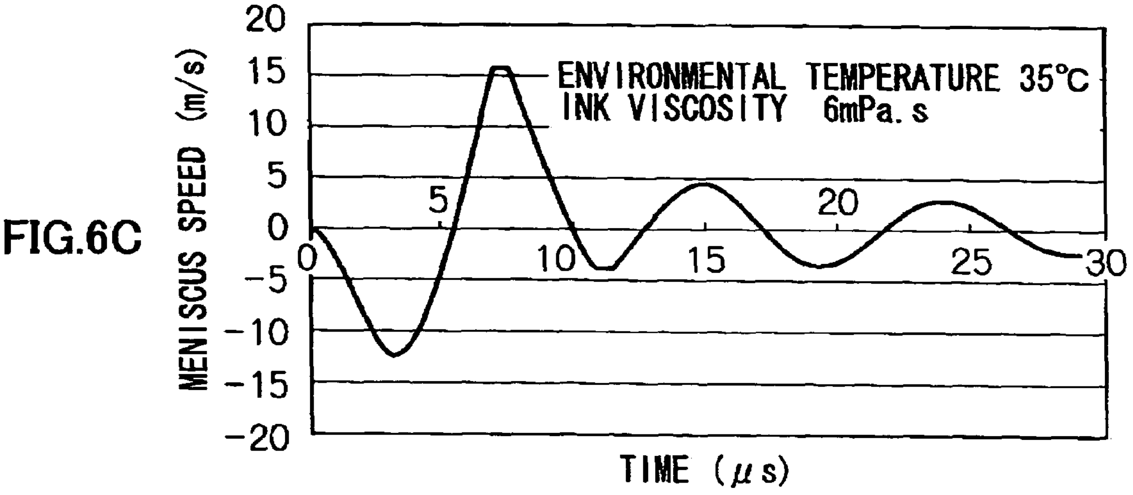

FIG. 5 shows a general fine drop ejection driving waveform, which is applied, to the piezoelectric element 42 when a fine drop is ejected from the ink ejecting nozzle 40. FIGS. 6A to 6C shows measurement results of meniscus speed when the same kind of ink was charged, only the environmental temperature was set to 5° C., 25° C. and 35° C., respectively, and the fine drop ejection driving waveform shown in FIG. 5 was applied to the piezoelectric element 42 of a recording head 36. The ink viscosities shown in FIGS. 6A to 6C show the measurement results of the ink viscosity at the respective environmental temperatures.

As shown in FIGS. 6A to 6C, when the same driving waveform is applied irrespective of the environmental temperature, a large difference is generated in the meniscus speed due to a variation of the environmental temperature. The difference in meniscus speed caused by the environmental temperature difference means that the discharging state of the liquid drop varies greatly depending upon the environmental temperature. When a single driving waveform is used, it is difficult to stably and excellently eject the liquid drop at all of the environmental temperatures.

Hence, in this embodiment, in order to excellently eject ink irrespective of the environmental temperature variation, temperature in the printer 10 is detected by a temperature detection sensor 18, and the recording head controller 100 adjusts the driving waveform to be applied to the piezoelectric element 42 in accordance with the detected temperature.

Figure 7A:
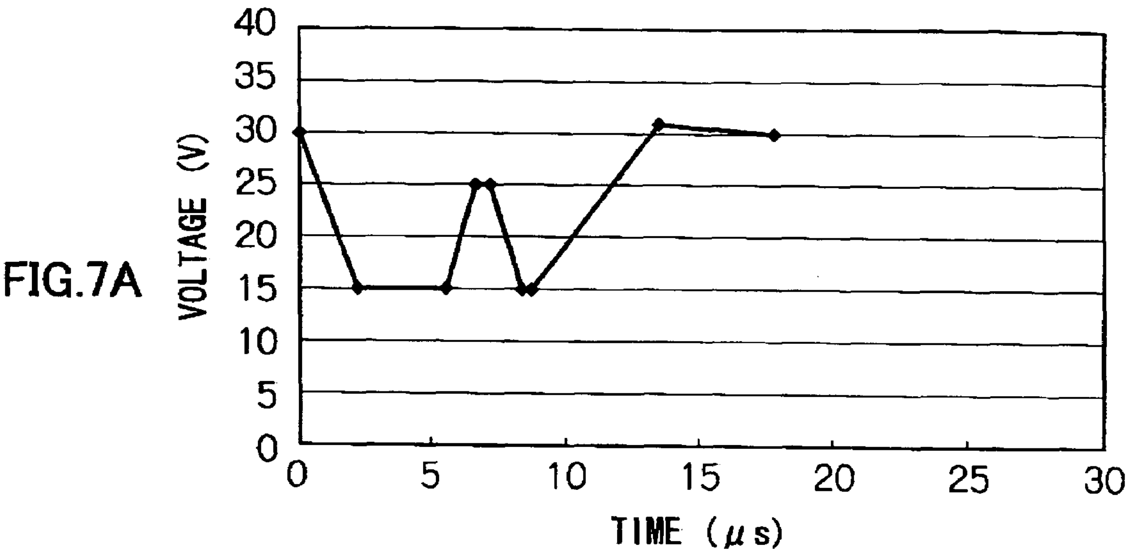
FIG. 7A is a diagram showing one example of a driving waveform adjusted by a recording head controller 100 in accordance with the environmental temperature, when the environmental temperature is 5° C.
Figure 7B:
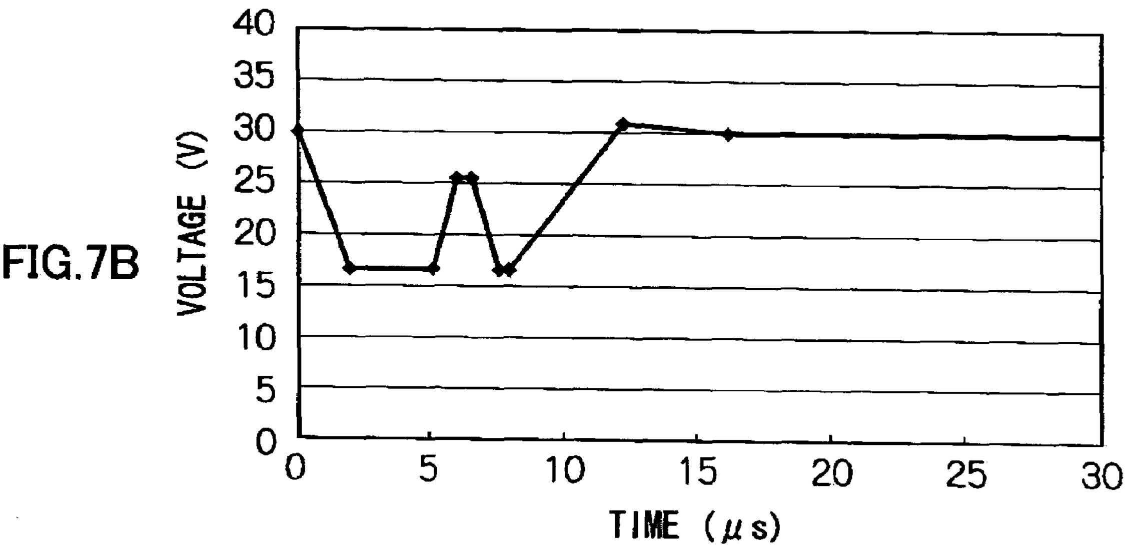
FIG. 7B is a diagram showing one example of a driving waveform adjusted by a recording head controller 100 in accordance with the environmental temperature, when the environmental temperature is 25° C.
Figure 7C:
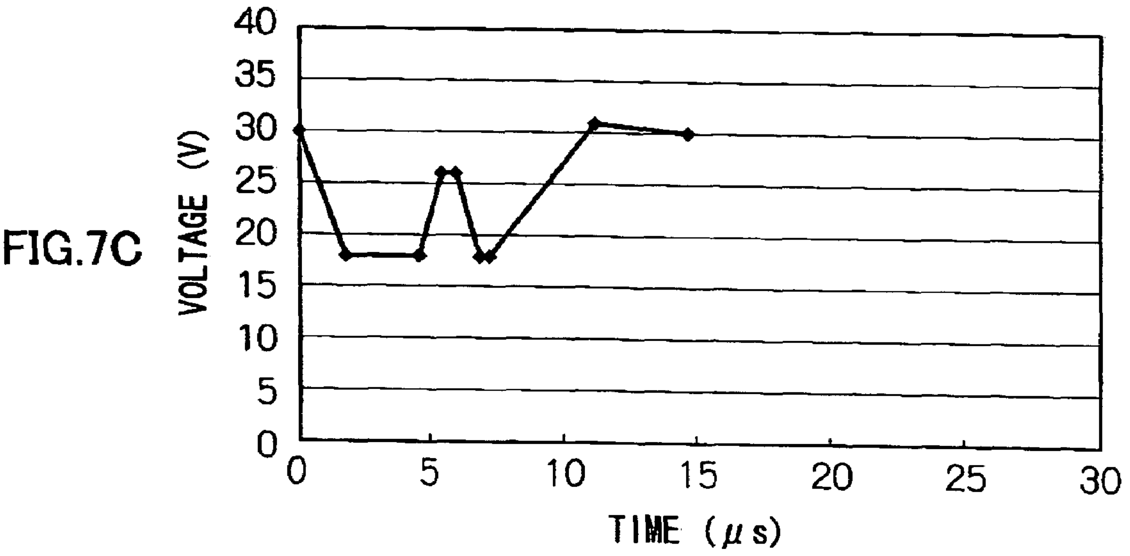
FIG. 7C is a diagram showing one example of a driving waveform adjusted by a recording head controller 100 in accordance with the environmental temperature, when the environmental temperature is 35° C.

FIGS. 7A to 7C show examples of the driving waveform adjusted by the recording head controller 100 in accordance with the environmental temperature. FIG. 7A shows the driving waveform applied to the piezoelectric element 42 when the environmental temperature is 5° C., FIG. 7B shows the driving waveform applied to the piezoelectric element 42 when the environmental temperature is 25° C., and FIG. 7C shows the driving waveform applied to the piezoelectric element 42 when the environmental temperature is 35° C.

As shown in FIGS. 7A to 7C, in this embodiment, the driving waveform is extended and contracted in the voltage axial direction and time axial direction in accordance with the ink viscosity which is varied in accordance with the environmental temperature variation.

A basic method for extending and contracting the driving waveform will be explained below.

First, expansion and contraction in the voltage axial direction expands and contracts the driving waveform such that as the temperature detected by the temperature detection sensor 18 becomes lower (ink viscosity becomes higher), the voltage variation amount of the driving waveform becomes greater. Here, it is preferable that the driving waveform is expanded and contracted such that the magnification of expansion and contraction of the voltage variation amount with respect to the reference potential (30 V in the examples of FIGS. 7A to 7C) of the driving waveform becomes constant.

Next, the expansion and contraction in the time axial direction expands and contracts the driving waveform such that as the temperature detected by the temperature detection sensor 18 becomes lower (ink viscosity becomes higher), the length of the driving waveform becomes longer. It is preferable that the driving waveform is expanded and contracted such that the time interval between the reference time of the driving waveform (e.g., time period of 0 μs in FIGS. 7A to 7C) and each nodal point is varied at a constant magnification of expansion and contraction.

Figure 8A:
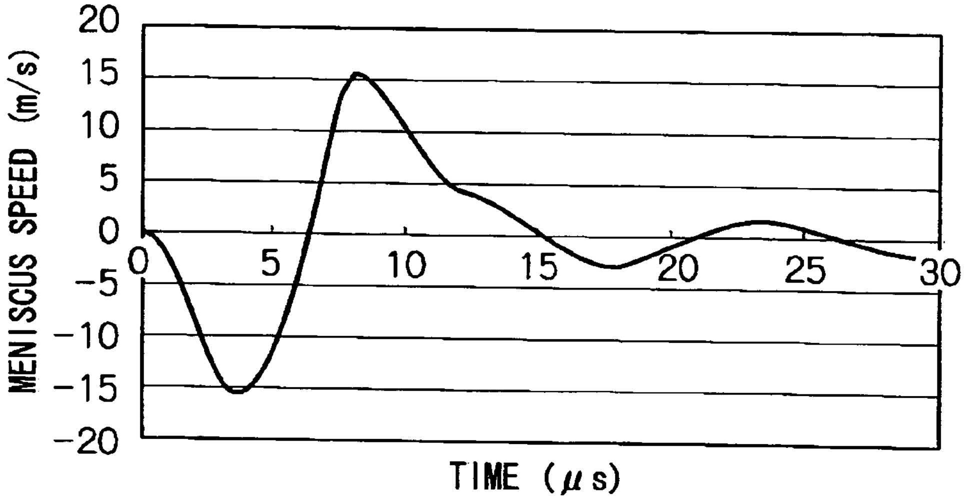
FIG. 8A shows a measurement result of the meniscus speed when the driving waveform shown in FIG. 7A is applied to the piezoelectric element when the environmental temperature is 5° C.
Figure 8B:
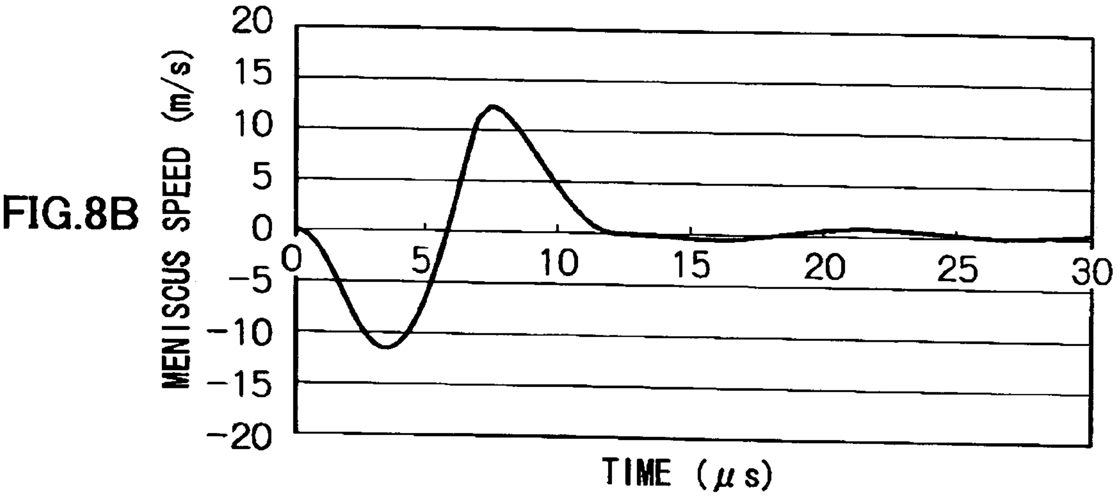
FIG. 8B shows a measurement result of the meniscus speed when the driving waveform shown in FIG. 7B is applied to the piezoelectric element when the environmental temperature is 25° C.
Figure 8C:
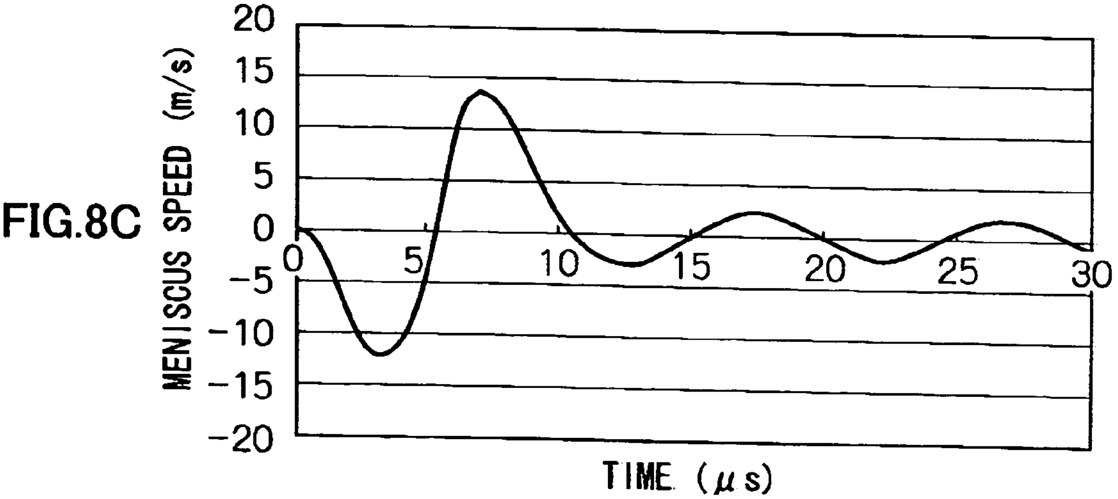
FIG. 8C shows a measurement result of the meniscus speed when the driving waveform shown in FIG. 7C is applied to the piezoelectric element when the environmental temperature is 35° C.

FIGS. 8A to 8C show measurement results of the meniscus speed when the driving waveforms shown in FIGS. 7A to 7C are applied to the piezoelectric element when the environmental temperature is 5° C., 25° C. and 35° C., respectively.

As shown in FIGS. 8A to 8C, the meniscus speeds at respective environmental temperatures are substantially equal to each other. It can be found that if the driving waveform is adjusted such that it is expansion and contraction at the same magnification in the voltage axial direction and time axial direction as in this embodiment, the variation in meniscus speed caused by the variation in the environmental temperature can be suppressed to a small level.

When an ejection experiment is actually carried out using the driving waveforms shown in FIGS. 7*a* to 7C the measured drop speeds are 9.8 m/s when the environmental temperature is 5° C., 8.9 m/s when the environmental temperature is 25° C., and 9.5 m/s when the environmental temperature is 35° C., and although slight variation is generated in the state of satellite droplet generation, it can be confirmed that the variation in ejection characteristics (difference in drop speed) caused by the environmental temperature can be suppressed to a small value. As a comparative example, an ejection experiment of liquid drops can be carried out using the driving waveforms shown in FIGS. 6A to 6C. The measured drop speeds are 4.9 m/s when the environmental temperature is 5° C., 7.0 m/s when the environmental temperature is 25° C., and 9.9 m/s when the environmental temperature is 35° C., and great variation in the drop speed is generated. Also, when the environmental temperature is 5° C., it is observed that a large amount of low speed satellite droplets are generated after the liquid drop ejection, and if they collided against the recording sheet surface, the quality of image is deteriorated greatly.

Figure 9A:
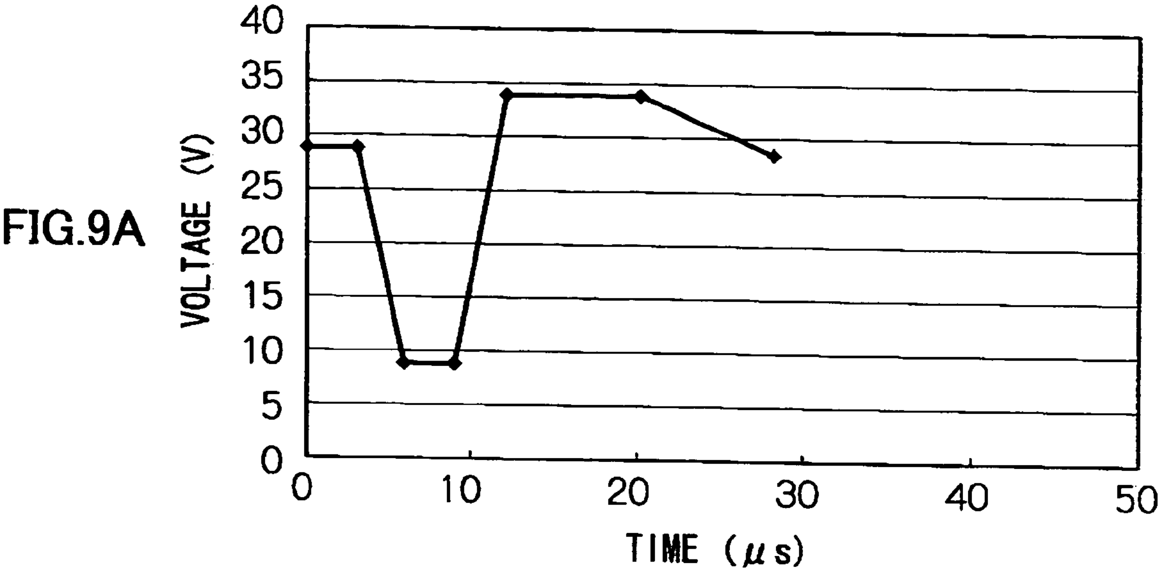
FIGS. 9A and 9B each show one of two driving waveform examples in which only the shape of a reverberation adjustor of the pressure wave was changed after ink was ejected.
Figure 9B:
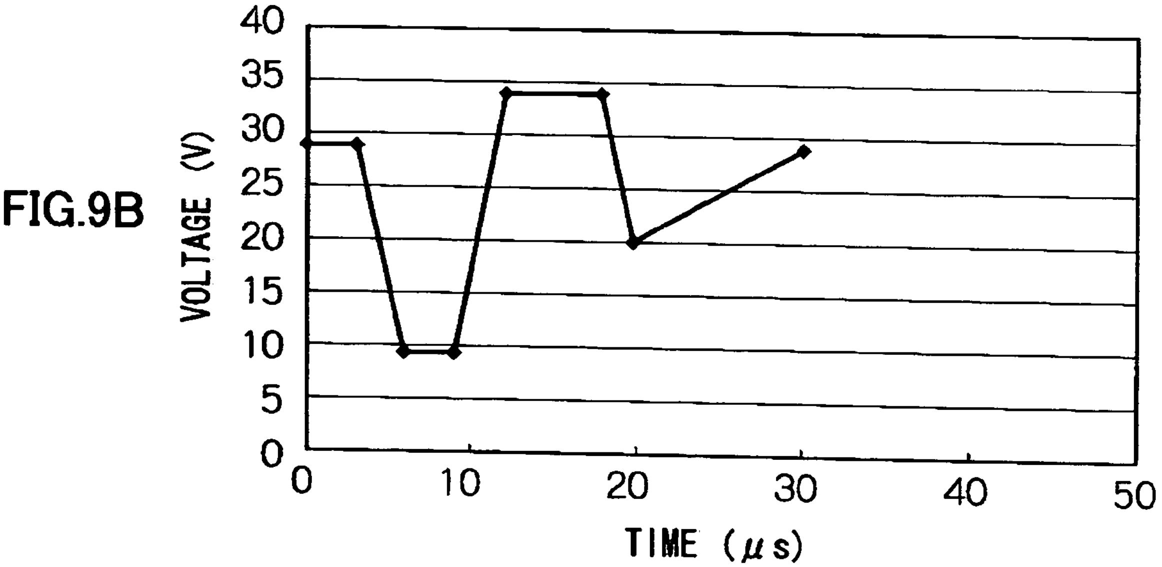

FIGS. 9A and 9B show one example each of two driving waveforms in which only the shape of a reverberation adjustor of the pressure wave, the part of the pressure wave is which adjusts the reverberation (hereinafter, referred to as "reverberation"), was changed after ink was ejected. In FIG. 9A, the voltage level is returned to its original level slowly. In FIG. 9B, it is adjusted such that the voltage level is adjusted to a low voltage level and then returned to the original level.

Figure 10A:
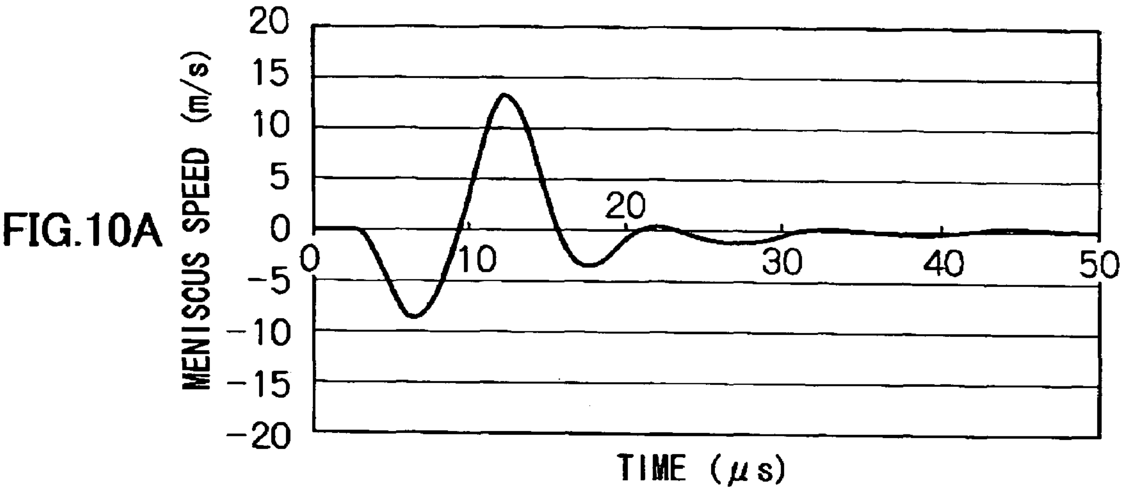
FIG. 10A shows the meniscus speed when the driving waveform shown in FIG. 9A is applied.
Figure 10B:
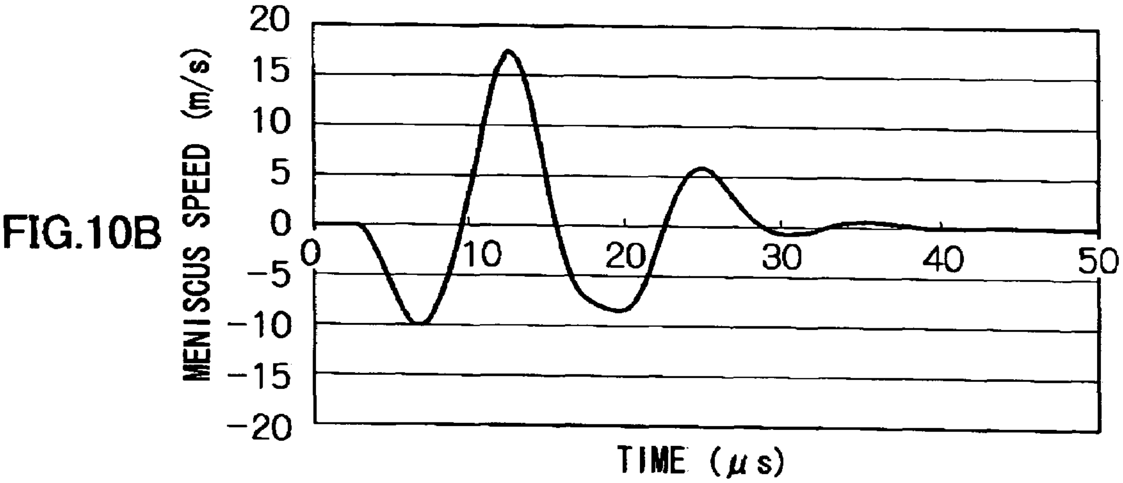
FIG. 10B shows the meniscus speed when the driving waveform shown in FIG. 9B is applied.

FIGS. 10A and 10B show the meniscus speed when the driving waveform is applied to the piezoelectric element 42. FIG. 10A shows a case in which the driving waveform shown in FIG. 9A is applied, and FIG. 10B shows a case in which the driving waveform shown in FIG. 9B is applied.

It can be found that the waveform of the reverberation adjustor is adjusted such that in FIG. 10A the reverberation is suppressed by gradually varying the voltage level, and in the case of FIG. 10B, the voltage level increases or reduces in accordance with the natural oscillation period and the reverberation is amplified.

Waveform of the reverberation adjustor is usually adjusted such that the pressure wave reverberation is reduced after ejection as shown in FIG. 9A, but in the case of a head using high viscosity ink, since the pressure wave is naturally attenuated abruptly, there is practically no reverberation remaining after ejection, especially when the environmental temperature is low. However, since ink release becomes excellent with reverberation, especially when a large drop having large liquid drop volume is to be ejected, it is preferable that appropriate reverberation remains after ejection in order to prevent generation of satellite droplets or mist.

Figure 11A:
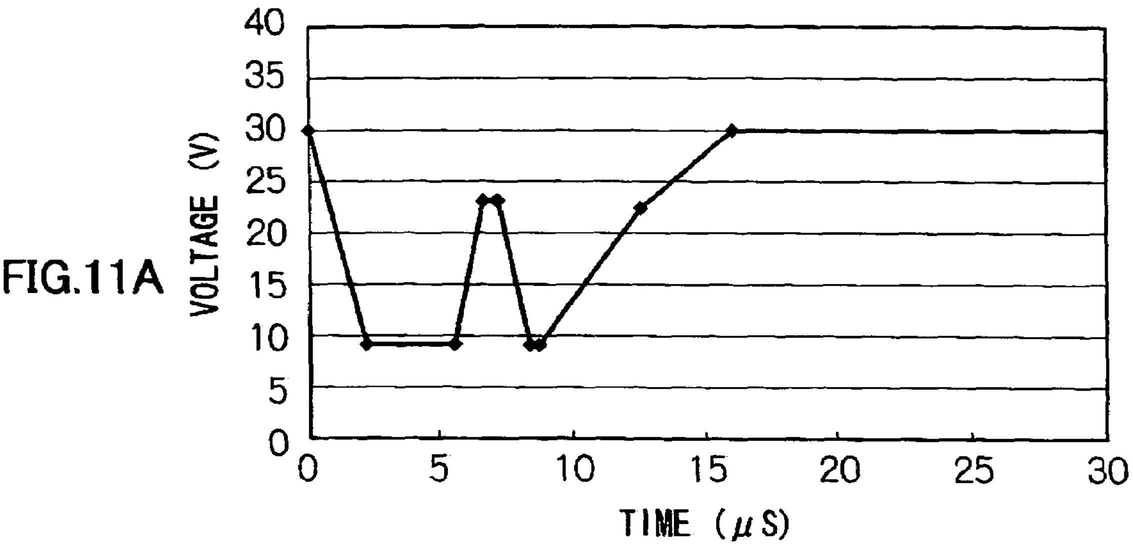
FIGS. 11A to 11C respectively show driving waveforms in which reverberation adjustors are individually adjusted and applied to the driving waveforms shown in FIGS. 7A to 7C.
Figure 11B:
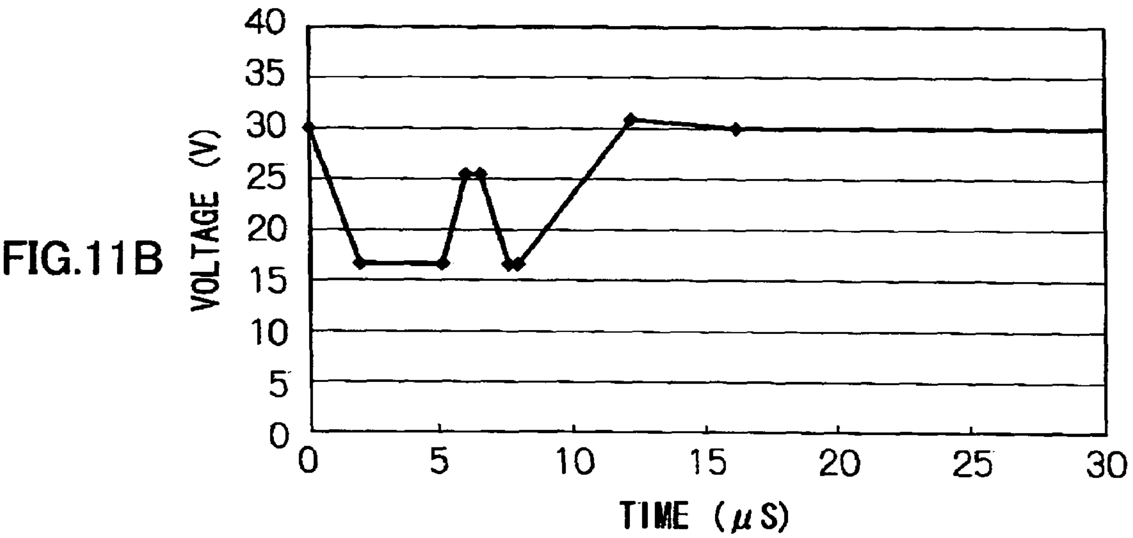
Figure 11C:
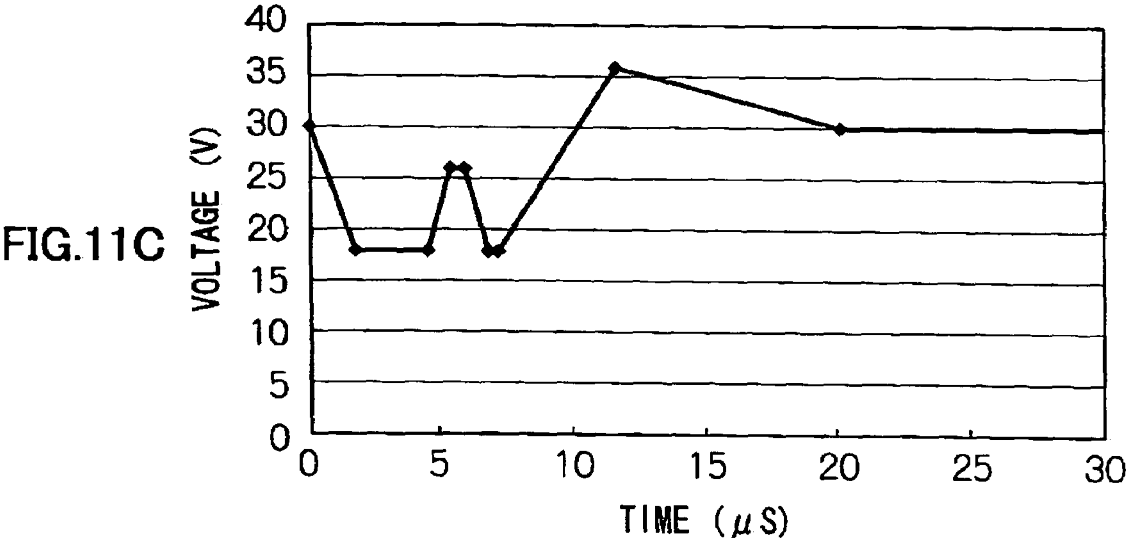

FIGS. 11A to 11C respectively show driving waveforms in which the reverberation adjustors of the latter half of the waveform were individually adjusted based on the driving waveforms shown in FIGS. 7A to 7C. FIG. 11A shows a driving waveform applied to the piezoelectric element 42 when the environmental temperature is 5° C., FIG. 11B shows driving waveform applied to the piezoelectric element 42 when the environmental temperature is 25° C., and FIG. 11C shows driving waveform applied to the piezoelectric element 42 when the environmental temperature is 35° C.

As shown in FIGS. 11A to 11C, the reverberation is more positively suppressed as the environmental temperature becomes higher (see FIG. 11C). Since FIGS. 11A to 11C show examples of the waveform of the fine drop ejection, the reverberation adjustor does not have such a shape that the reverberation is amplified when the environmental temperature is low, but it is preferable that the reverberation adjustor has such a shape that the reverberation is amplified (shape of the reverberation adjustor shown in FIG. 9B for example) in the case of a waveform for discharging a large drop.

Figure 12A:
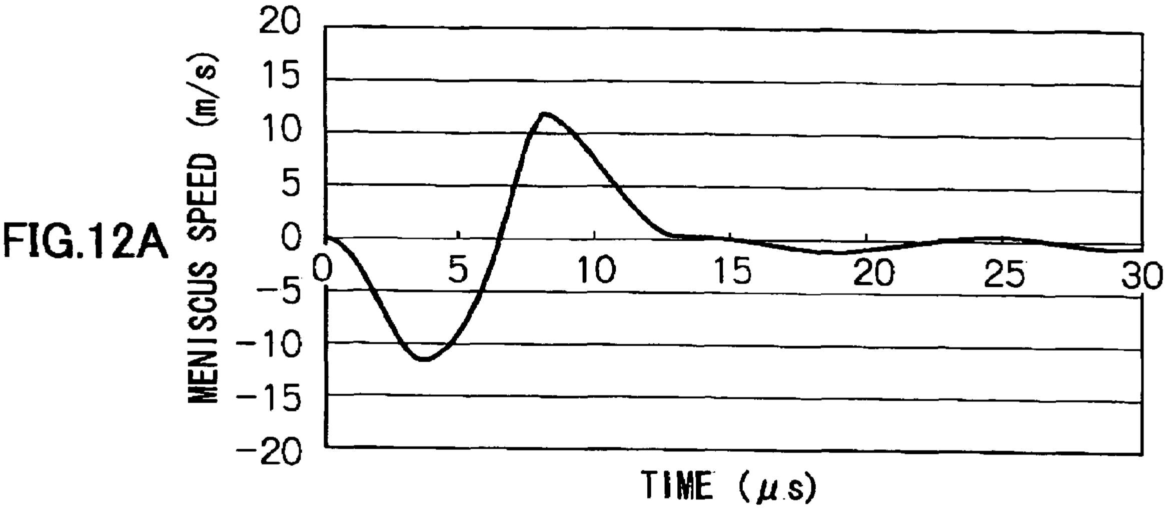
FIGS. 12A to 12C show changing states of the meniscus speed when the respective driving waveforms in FIGS. 11A to 11C are applied.
Figure 12B:
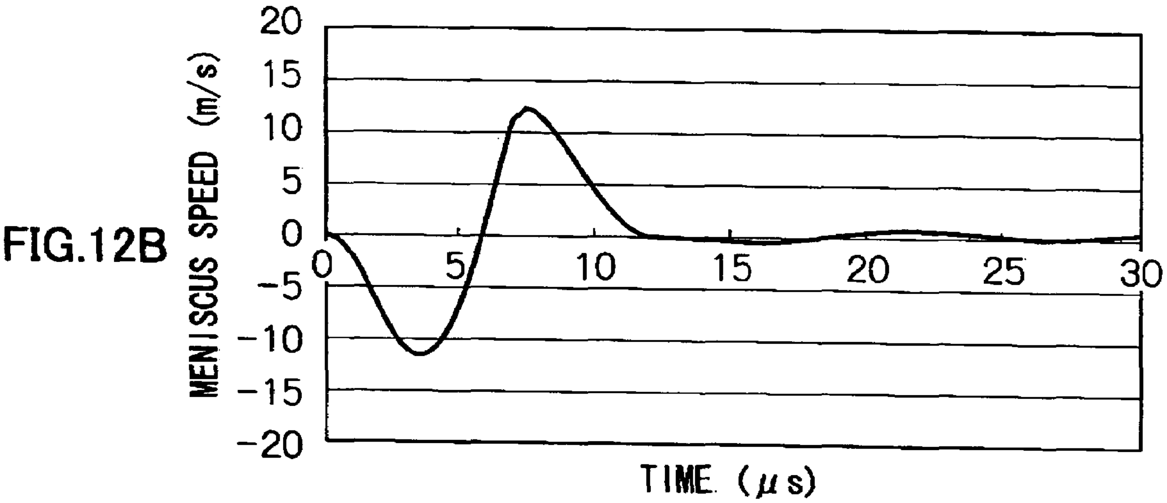
Figure 12C:
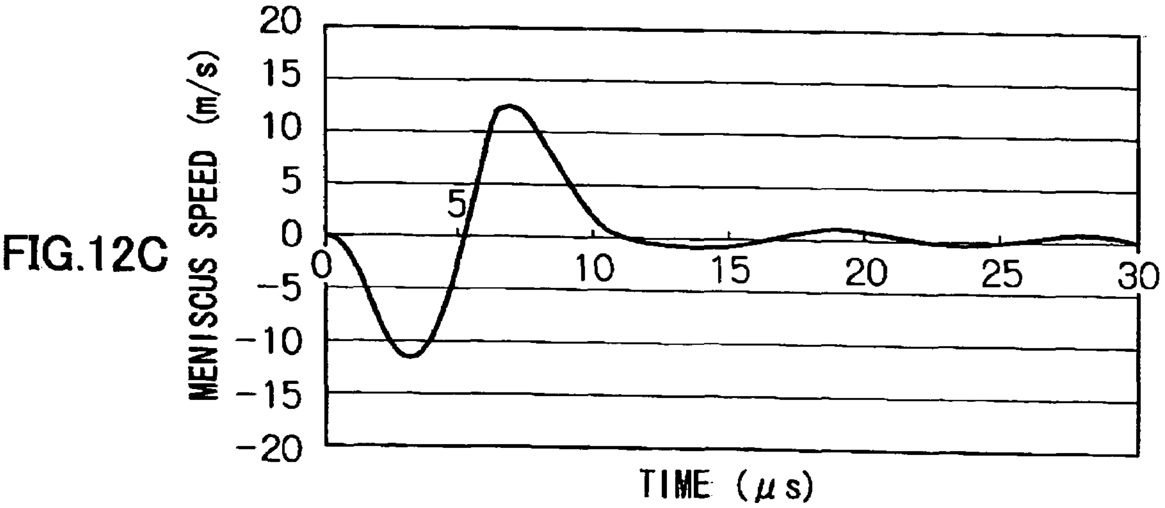

FIGS. 12A to 12C show changing states of the meniscus speed when the driving waveforms in respectively FIGS. 11A to 11C are applied.

As shown in FIGS. 12A to 12C, the driving waveform is adjusted while taking into consideration the reverberation after meniscus speed at the time of ejection, and reverberation after ejection in accordance with the varying environmental temperature, and the driving waveform is applied. With this, even if the pressure wave natural oscillation period Tc and the attenuation constant Dc vary greatly with the environmental temperature, the meniscus speed can be varied in the same manner irrespective of the environmental temperature, and it is possible to always realize stable and uniform ejection.

When an ejection experiment of liquid drop is actually carried out using the driving waveforms shown in FIGS. 11A to 11C the measured drop speed is 8.1 m/s when the environmental temperature is 5° C., and 8.2 m/s when the environmental temperature is 35° C., and it is confirmed that the drop speed variation caused by the environmental temperature can be suppressed to an extremely small value. It is also confirmed that the state of satellite droplet generation is almost the same at the respective temperatures, and no deterioration is generated in image quality by the low speed satellite droplets.

As explained in detail above, according to the embodiment, predetermined voltage is applied to give an oscillatory wave to the ink accommodated in the pressure chamber 46 using the piezoelectric element 42, thereby allowing the ink ejection nozzle 40 to eject an ink drop onto record image. Here, the temperature detection sensor 18 detects the environmental temperature, the recording head controller 100 expands or contracts, with the same magnification the driving waveform applied to the piezoelectric element 42 in the voltage axial direction and time axial direction, such that the driving waveform becomes smaller as the environmental temperature becomes higher in accordance with the detected environmental temperature. Therefore, high viscosity liquid can be ejected excellently irrespective of the environmental temperature.

According to the embodiment, of the driving waveform to be applied to the piezoelectric element 42, the waveform of the reverberation adjustor, which adjusts the reverberation of the pressure wave after an ink drop is ejected, is varied in accordance with the detected environmental temperature and applied. Therefore, the waveform of the reverberation adjustor of the driving waveform can be adjusted in accordance with the environmental temperature separately from the expansion and contraction in the voltage axial direction and time axial direction.

For example, even when the viscosity becomes excessively high because the environmental temperature is low and most reverberation is eliminated, it is possible to provide appropriate reverberation and liquid can be favorably ejected by changing the shape of the waveform of the reverberation adjustor such that the reverberation is more amplified as the detected temperature becomes lower.

When the viscosity becomes excessively low because the environmental temperature is high and the reverberation becomes excessively large, it is possible to favorably suppress the reverberation and liquid can be smoothly ejected by changing the shape of the waveform of the reverberation adjustor such that the reverberation is suppressed as the temperature becomes higher.

In this manner, by combining the expansion and contraction of the driving waveform in the time axial direction and voltage axial direction and variation in waveform of the reverberation adjustor, it is possible to eject a liquid drop in a robust manner with respect to the environmental temperature variation.

Although ink having viscosity of 10 mPa·s or higher is used in the embodiment, the present invention is not limited to this. For example, the invention can appropriately be applied when viscosity changes due to environmental temperature variation, and this change varies the natural oscillation period Tc of pressure wave.

Although liquid having the ratio of the angular frequency Ec and attenuation constant Dc of pressure wave in a range of Dc/Ec>0.2 is used in the embodiment, the invention is not limited to this.

Although the piezoelectric element 42 is used in the embodiment, other electromechanical transducers, such as an electrostatic actuator or magnetic actuator may also be used. Types of piezoelectric element are also not limited to the one shown in this embodiment.

Furthermore, the temperature in the vicinity of the recording head unit 37 in the printer 10 was detected by the temperature detection sensor 18 as the environmental temperature in the embodiment, but the invention is not limited to this. The environmental temperature may be a temperature that can be used to estimate the temperature (and hence viscosity) of the liquid charged into the recording head 36. For example, a temperature sensor may be mounted on the recording head 36, or the temperature sensor may be mounted on other portion in the printer 10, and a table can be drawn up in which the temperature detected by the sensor and liquid temperature (viscosity) charged into the recording head 36 are previously associated with each other, enabling the temperature (viscosity) of the liquid to be specified. It is effective to detect temperature at a plurality of locations. By doing so, temperature can be detected more precisely.

The structure (see FIGS. 1 and 2) of the printer 10 of the embodiment is one example thereof, and it can, of course, be appropriately modified. That is, in FIG. 1, the ink-jet recording apparatus has ink-jet recording heads for discharging ink drops of black, yellow, magenta, cyan as the liquid drop ejecting apparatus of the present invention, but the liquid drop ejecting head and the liquid drop ejecting apparatus of the present invention are not limited to those which record images (including text) on the recording sheets P. That is, the recording medium is not limited to paper, and furthermore the liquid to be ejected is not limited to ink. For example, liquid drop ejecting apparatuses for industrial purposes are widely included, such as for discharging ink on high polymer films or glass to form display color filters, or discharging welding solder on a substrate to form a bump for mounting parts. The liquid drop ejecting apparatus is not limited to a FWA, and the invention may be applied to a Partial Width Array (PWA) having main scanning mechanism and auxiliary scanning mechanism. Furthermore one pass type may be employed rather than multi-pass type.

The measured values shown in FIGS. 3 to 12C are also the examples, and the values vary, of course, depending upon specification of the actual recording head and kind (viscosity) of liquid.

While the present invention has been described and illustrated with respect to some specific embodiments thereof, it is to be understood that the present invention is by no means limited thereto and encompasses all changes and modifications which will become possible without departing from the scope of the appended claims.

What is claimed is:

1. A driving method of a liquid drop ejecting head in which an oscillatory wave is imparted to a liquid accommodated in a pressure chamber using an electromechanical transducer which is driven by applying a predetermined driving waveform to the electromechanical transducer, thereby discharging a liquid drop from a nozzle to record an image, the driving method comprising:

detecting an environmental temperature, and expanding and/or contracting the driving waveform to be applied to the electromechanical transducer in a voltage axial direction and a time axial direction in accordance with the detected environmental temperature, and applying the resulting driving waveform to the electromechanical transducer, and in the driving waveform to be applied to the electromechanical transducer, a waveform of a reverberation adjustor, which adjusts a residual oscillation of the liquid, is adjusted in accordance with the detected environmental temperature and is applied to the electromechanical transducer.

2. The driving method of the liquid drop ejecting head according to claim 1, wherein the expansion and/or contraction of the driving waveform are carried out in the voltage axial direction and/or time axial direction such that the magnitude of the driving waveform is increased as the detected environmental temperature becomes lower.

3. The driving method of the liquid drop ejecting head according to claim 2, wherein the expansion and/or contraction of the driving waveform is carried out such that an expansion ratio and/or contraction ratio of the driving waveform becomes constant with respect to a reference potential.

4. The driving method of the liquid drop ejecting head according to claim 3, wherein in the driving waveform to be applied to the electromechanical transducer, a waveform of a reverberation adjustor, which adjusts a residual oscillation of the liquid, is adjusted in accordance with the detected environmental temperature and is applied to the electromechanical transducer.

5. The driving method of the liquid drop ejecting head according to claim 3, wherein the shape of the waveform of the reverberation adjustor, which adjusts a residual oscillation of the liquid, is changed such that the residual oscillation is amplified as the detected environmental temperature becomes lower.

6. The driving method of the liquid drop ejecting head according to claim 3, wherein shape of the waveform of a reverberation adjustor, which adjusts residual oscillation of the liquid, is changed such that the residual oscillation is suppressed as the detected environmental temperature becomes higher.

7. The driving method of the liquid drop ejecting head according to claim 2, wherein the shape of the waveform of the reverberation adjustor, which adjusts a residual oscillation of the liquid, is changed such that the residual oscillation is amplified as the detected environmental temperature becomes lower.

8. The driving method of the liquid drop ejecting head according to claim 2, wherein shape of the waveform of a reverberation adjustor, which adjusts residual oscillation of the liquid, is changed such that the residual oscillation is suppressed as the detected environmental temperature becomes higher.

9. The driving method of the liquid drop ejecting head according to claim 1, wherein in the driving waveform to be applied to the electromechanical transducer, a waveform of a reverberation adjustor, which adjusts a residual oscillation of the liquid, is adjusted in accordance with the detected environmental temperature and is applied to the electromechanical transducer.

10. The driving method of the liquid drop ejecting head according to claim 9, wherein the shape of the waveform of the reverberation adjustor is changed such that the residual oscillation is amplified as the detected environmental temperature becomes lower.

11. The driving method of the liquid drop ejecting head according to claim 9, wherein shape of the waveform of the reverberation adjustor is changed such that the residual oscillation is suppressed as the detected environmental temperature becomes higher.

12. The driving method of the liquid drop ejecting head according to claim 1, wherein the shape of the waveform of the reverberation adjustor, which adjusts a residual oscillation of the liquid, is changed such that the residual oscillation is amplified as the detected environmental temperature becomes lower.

13. The driving method of the liquid drop ejecting head according to claim 1, wherein the shape of the waveform of a reverberation adjustor, which adjusts a residual oscillation of the liquid, is changed such that the residual oscillation is suppressed as the detected environmental temperature becomes higher.

14. The driving method of the liquid drop ejecting head according to claim 1, wherein shape of the waveform of the reverberation adjustor is changed such that the residual oscillation is suppressed as the detected environmental temperature becomes higher.

15. The driving method of the liquid drop ejecting head according to claim 1, wherein liquid having viscosity of 10 mPa·s or higher is used as the liquid.

16. The driving method of the liquid drop ejecting head according to claim 1, wherein liquid in which a ratio of angular frequency Ec and attenuation constant Dc of pressure wave oscillation is in a range of $Dc/Ec>0.2$ is used as the liquid.

17. The driving method of the liquid drop ejecting head according to claim 1, wherein a piezoelectric actuator is used as the electromechanical transducer.

18. A driving method of a liquid drop ejecting head in which an oscillatory wave is imparted to a liquid accommodated in a pressure chamber using an electromechanical transducer which is driven when a predetermined driving waveform is applied to the electromechanical transducer, thereby discharging a liquid drop from a nozzle to record an image, the driving method comprising:

detecting an environmental temperature, and expanding and/or contracting the driving waveform to be applied to the electromechanical transducer, in a voltage axial direction and a time axial direction, in accordance with the detected environmental temperature and applying the resulting driving waveform to the electromechanical transducer, wherein the expansion and/or contraction of the driving waveform are carried out in the voltage axial direction and time axial direction such that the magnitude of the driving waveform is increased as the detected environmental temperature becomes lower, the expansion and/or contraction of the driving waveform are carried out such that the expansion ratio and/or contraction ratio of the driving waveform becomes constant with respect to a reference potential, in the driving waveform to be applied to the electromechanical transducer, a waveform of a reverberation adjustor, which adjusts a residual oscillation of the liquid, is adjusted in accordance with the detected environmental temperature and is applied to the electromechanical transducer, the shape of the waveform of the reverberation adjustor is changed such that the residual oscillation is amplified as the detected environmental temperature becomes lower, the shape of the waveform of the reverberation adjustor is changed such that the residual oscillation is suppressed as the detected environmental temperature becomes higher.

19. The driving method of the liquid drop ejecting head according to claim 18, wherein liquid having viscosity of 10 mPa·s or higher is used as the liquid.

20. The driving method of the liquid drop ejecting head according to claim 18, wherein liquid in which a ratio of angular frequency Ec and attenuation constant Dc of pressure wave oscillation is in a range of Dc/Ec>0.2 is used as the liquid.

21. The driving method of the liquid drop ejecting head according to claim 18, wherein a piezoelectric actuator is used as the electromechanical transducer.

22. A liquid drop ejecting apparatus in which an oscillatory wave is imparted to liquid accommodated in a pressure chamber using an electromechanical transducer which is driven when a predetermined driving waveform is applied to the electromechanical transducer, thereby discharging a liquid drop from a nozzle to record an image, the liquid drop ejecting apparatus comprising, a detecting unit for detecting environmental temperature, and a driving waveform adjusting unit which expands and/or contracts the driving waveform to be applied to the electromechanical transducer, in a voltage axial direction and a time axial direction, in accordance with the detected environmental temperature, and which applies the resulting driving waveform to the electromechanical transducer, and in the driving waveform applied to the electromechanical transducer, a waveform of a reverberation adjustor, which adjusts a residual oscillation of the liquid, is adjusted in accordance with the detected environmental temperature and is applied to the electromechanical transducer.

* * * * *